United States Patent
Liu et al.

(10) Patent No.: US 7,974,369 B2
(45) Date of Patent: Jul. 5, 2011

(54) PHASE DETECTOR FOR TIMING RECOVERY LOOP

(75) Inventors: Jingfeng Liu, Longmont, CO (US); Hongwei Song, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 33 days.

(21) Appl. No.: 12/609,031

(22) Filed: Oct. 30, 2009

(65) Prior Publication Data
US 2011/0103527 A1  May 5, 2011

(51) Int. Cl.
*H04L 27/06* (2006.01)
(52) U.S. Cl. ........ 375/341; 375/262; 375/373; 375/371; 375/375; 714/786; 714/794; 714/795
(58) Field of Classification Search .......... 375/341, 375/262, 373, 371, 375; 714/786, 794, 795
See application file for complete search history.

(56) References Cited

U.S. PATENT DOCUMENTS

| | | | |
|---|---|---|---|
| 7,239,682 B2 * | 7/2007 | Liu et al. ............ | 375/355 |
| 7,499,507 B2 * | 3/2009 | Jaffe et al. ............ | 375/341 |
| 7,653,155 B1 * | 1/2010 | Ormesher et al. ..... | 375/341 |
| 2008/0212708 A1 * | 9/2008 | Koslov ............. | 375/286 |

OTHER PUBLICATIONS

Langlais, "Synchronization in the carrier recovery of a satellite link using turbo-codes with the help of tentative decisions", IEE Colloquium on Turbo Codes in Digital Broadcasting—Could It Double Capacity?, Nov. 22, 1999 pp. 5/1-5/7.*

Liu, "Dual segmented Kalman filters based symbol timing recovery for low-SNR partial response data storage channels" IEEE global telecommunications conference, conference proceedings of globecomy03, vol. 7, Dec. 1, 2003, Dec. 5, 2003 pp. 4084-4090.*

Lee, "joint LDPC decoding and timing recovery using code constraint feeback" IEEE communications letters, vol. 10, No. 3, Mar. 1, 2006, pp. 189-191.*

Dervin, "A soft decision directed phase detector suited to satellite communications at very low signal to noise ratio", 2005 IEEE 6th Workshop on Signal Processing Advances in Wireless Communications, Publication Year: 2005 , pp. 146-150.*

Valles, "Carrier and Timing Synchronization of BPSK vi a LDPC Code Feedback" '06 fortieth Asilomar conference on signals, systems and computers, 2006, IEEE, Oct. 2006, pp. 2177-2181.*

Shehata, "Joint iterative detection and phase noise estimation algorithms using Kalman filtering" IEEE 11th Canadian workshop on information theory—CWIT 2009, May 13, 2009, pp. 165-168.*

Mottier, "Influence in tentative decisions provided by a Turbo-decoder on the carrier synchronization: Application to 64-QAM signals", COST 254 workshop on Emerging Techniques for Communication Terminals, Toulouse France Jul. 7-9, 1997, pp. 326-330.*

Simon, "Information-reduced carrier synchronization of BPSK and QPSK using soft decision feedback," Proc. IEEE 44th Allerton Conference on Communications, Control and Computing, Sep. 27-29, 2006.*

* cited by examiner

*Primary Examiner* — Juan A Torres
(74) *Attorney, Agent, or Firm* — Mendelsohn, Drucker & Associates, P.C.; Craig M. Brown; Steve Mendelsohn

(57) ABSTRACT

In one embodiment, a (hard-drive) read channel has a phase detector used in a timing recovery loop. The phase detector utilizes the sign bit and confidence value from a received log-likelihood ratio (LLR) signal to generate a mean value. The mean value is convolved with a partial response target to generate an estimated timing error signal. When implemented in a hard-drive read channel, the phase detector allows for timing recovery with lower loss-of-lock rates.

13 Claims, 3 Drawing Sheets

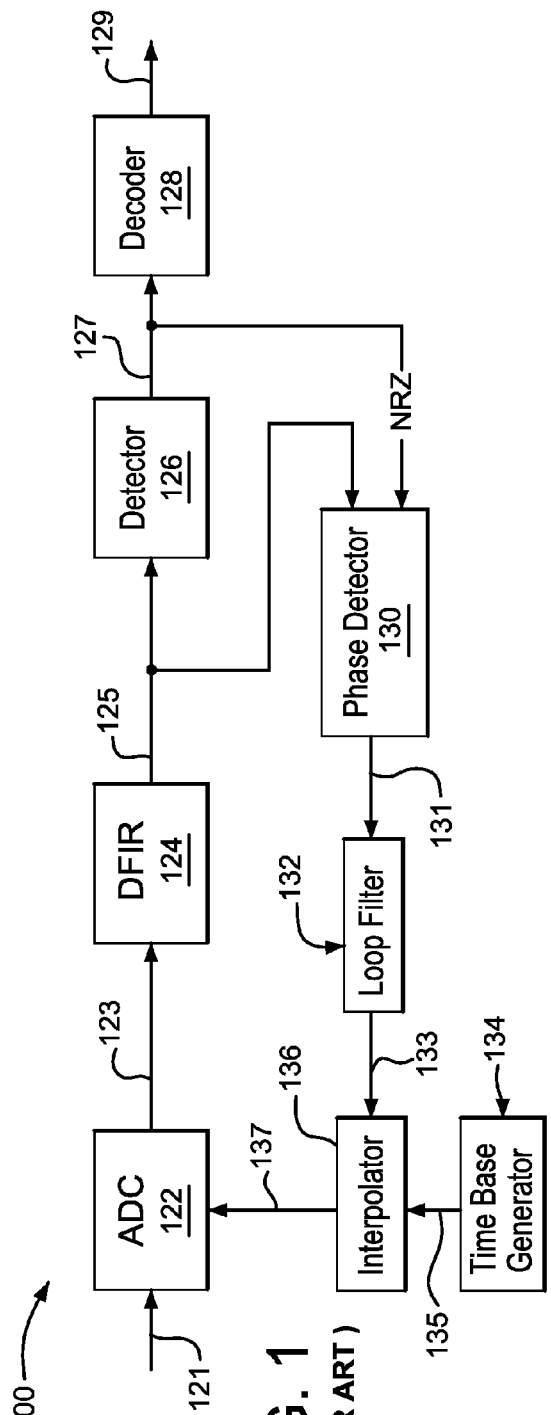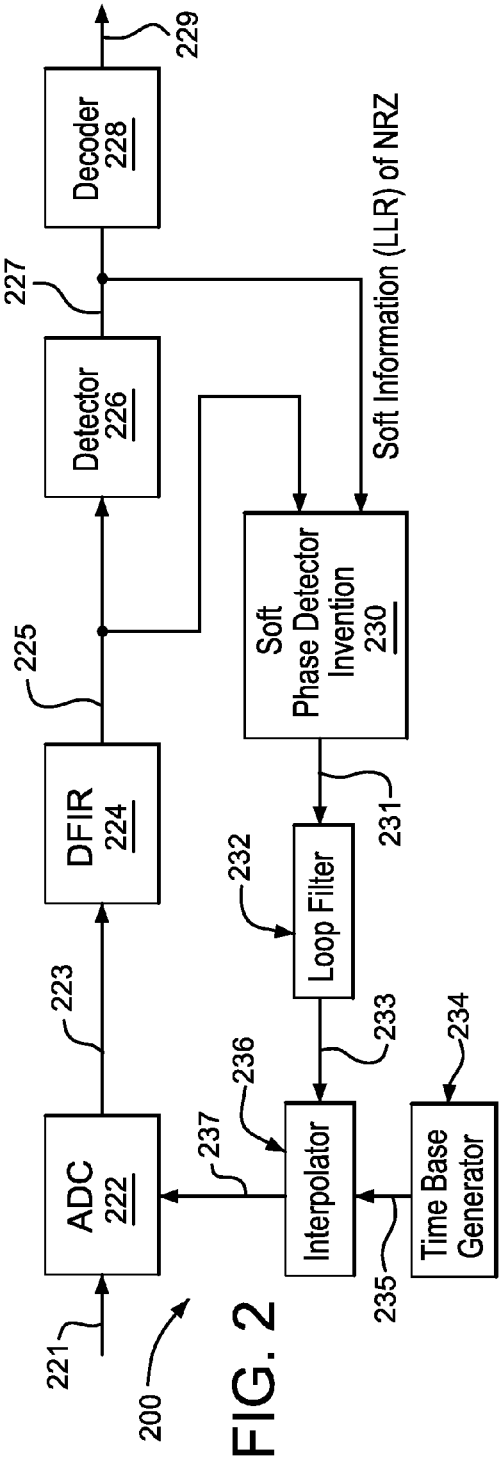
FIG. 1 (PRIOR ART)
FIG. 2

Look-up table (LUT) of the LLR to mean:

- LLR>=4 , Mean= 1
- LLR>=2 , Mean= 0.75
- LLR>=1 , Mean= 0.5
- 1>LLR>=-1 , Mean= 0,
- LLR>=-4 , Mean= -1
- LLR>=-2 , Mean= -0.75
- LLR>=-1 , Mean= -0.5

PHASE DETECTOR FOR TIMING RECOVERY LOOP

TECHNICAL FIELD

The disclosed subject matter is directed to signal processing and, in particular, to phase detection in timing recovery loops.

BACKGROUND

FIG. 1 is a block diagram of a prior-art read channel 100 for a hard drive. Read channel 100 receives an analog input signal 121 corresponding to data stored on the hard drive and generates a digital decoded output signal 129 representing the data stored on the hard drive.

In particular, analog-to-digital converter (ADC) 122 digitizes analog input signal 121 to generate digital input signal 123. Digital finite impulse response (DFIR) filter equalizer 124 equalizes digital input signal 123 to generate equalized digital signal 125. Soft detector 126 converts equalized digital signal 125 into soft values, such as multi-bit log likelihood ratio (LLR) values 127, where each LLR value has a hard-decision sign bit and a multi-bit (e.g., 4-bit) confidence value. Soft detector 126 implements a suitable detection technique, such as Viterbi soft-output detection or maximum a posteriori (MAP) detection, to generate LLR values 127. Decoder 128 decodes the LLR values to generate decoded output signal 129. For example, if the data stored on the hard drive is encoded using a low-density parity check (LDPC) code, then decoder 128 performs LDPC decoding to generate decoded output signal 129 from LLR values 127.

Phase detector 130 processes equalized digital signal 125 from equalizer 124 and the sign bits of LLR values 127 from soft detector 126 to generate an estimated timing error signal 131. In one conventional implementation, phase detector 130 generates estimated timing error signal 131 by (i) convolving the sign bits with a finite impulse response (FIR) filter, (ii) generating the difference between the FIR filter output and a one-cycle-delayed version of equalized digital signal 125, and (iii) multiplying that difference by an estimate of the slope of equalized digital signal 125. Loop filter 132 integrates estimated timing error signal 131 to output an averaged error signal 133. Time-base generator (e.g., local oscillator (LO)) 134 generates LO clock signal 135. Interpolator 136 shifts the phase of LO clock signal 135 based on averaged error signal 133 to generate sampling clock signal 137, which determines the timing of the sampling of analog input signal 121 by ADC 122.

In hard-drive read-channel technology, the signal-to-noise ratio (SNR) continues to decrease due to increasing storage density of the disks. Conventional timing-recovery phase detectors that estimate timing information from equalized samples (such as equalized digital signal 125) and hard decisions (such as the sign bits of LLR values 127) might not operate properly in low-SNR environments, resulting in an unacceptably high loss-of-lock rate (LOLR), which reduces system throughput.

SUMMARY of FIG. 1, only the sign bits of LLR values 127 are used by phase detector 130. As a result, phase detector 130 may output timing error signals that result in relatively high loss-of-lock rates and relatively low system throughput.

The disclosed subject matter addresses the problems of the contemporary art by providing a mechanism for graduated or "soft" changes in the Non Return Zeros (NRZs) and used to adjust the sampling clock signal for the ADC of the disclosed subject matter, as opposed to relatively large or "hard" changes of NRZs in the prior art. This is because the disclosed phase detector utilizes the sign bit and one or more and possibly all of the remaining confidence-value bits, in producing the estimated timing error signal. The confidence values allow the phase detector to treat different sign bits differently in producing the estimated timing error signal, where the confidence value provides reliability information for the received sign bit. For example, low confidence values for the sign bit may cause the phase detector to reduce the impact of the sign bit, while high confidence values may cause larger changes in the estimated timing error signals.

As a result of the disclosed subject matter, phase changes are detected with greater accuracy and reliability than with the prior-art phase detectors. Potentially large and sudden phase changes in the sampling clock signal of the prior art are replaced by smoother and more gradual "soft" phase changes with the disclosed system. This results in sampling clock signals that allow for gradual or "soft" adjustments in the ADC. Additionally, the disclosed phase detector performs its operations dynamically and "on the fly," without having to stop and readjust the interpolator.

In one embodiment, the present invention is a signal processor. The signal processor comprises, a signal processing path that converts an analog input signal into a digital output signal, wherein the signal processing path generates multi-bit soft values, each multi-bit soft value having a sign bit and a multi-bit confidence value; and, a timing recovery loop that uses the sign bits and one or more bits of the multi-bit confidence values of the soft values to generate a sampling clock signal used by the signal processing path to sample the analog input signal.

In another embodiment, the present invention is a method for signal processing. The method comprises converting an analog input signal into multi-bit soft values, each multi-bit soft value having a sign bit and a multi-bit confidence value; and, using the sign bits and one or more bits of the multi-bit confidence values of the soft values to generate a sampling clock signal to sample the analog input signal.

In another embodiment, the present invention is an apparatus for signal processing. The apparatus comprises means for converting an analog input signal into multi-bit soft values, each multi-bit soft value having a sign bit and a multi-bit confidence value; and, means for using the sign bits and one or more bits of the multi-bit confidence values of the soft values to generate a sampling clock signal to sample the analog input signal.

BRIEF DESCRIPTION OF THE DRAWINGS

Attention is now directed to the drawing figures, where like or corresponding numerals indicate like or corresponding components. In the drawings:

FIG. 1 is a block diagram of a prior-art read channel for a hard drive;

FIG. 2 is a block diagram of a read channel for a hard drive of the disclosed subject matter;

DETAILED DESCRIPTION OF THE DRAWINGS

Figures 3, 4:
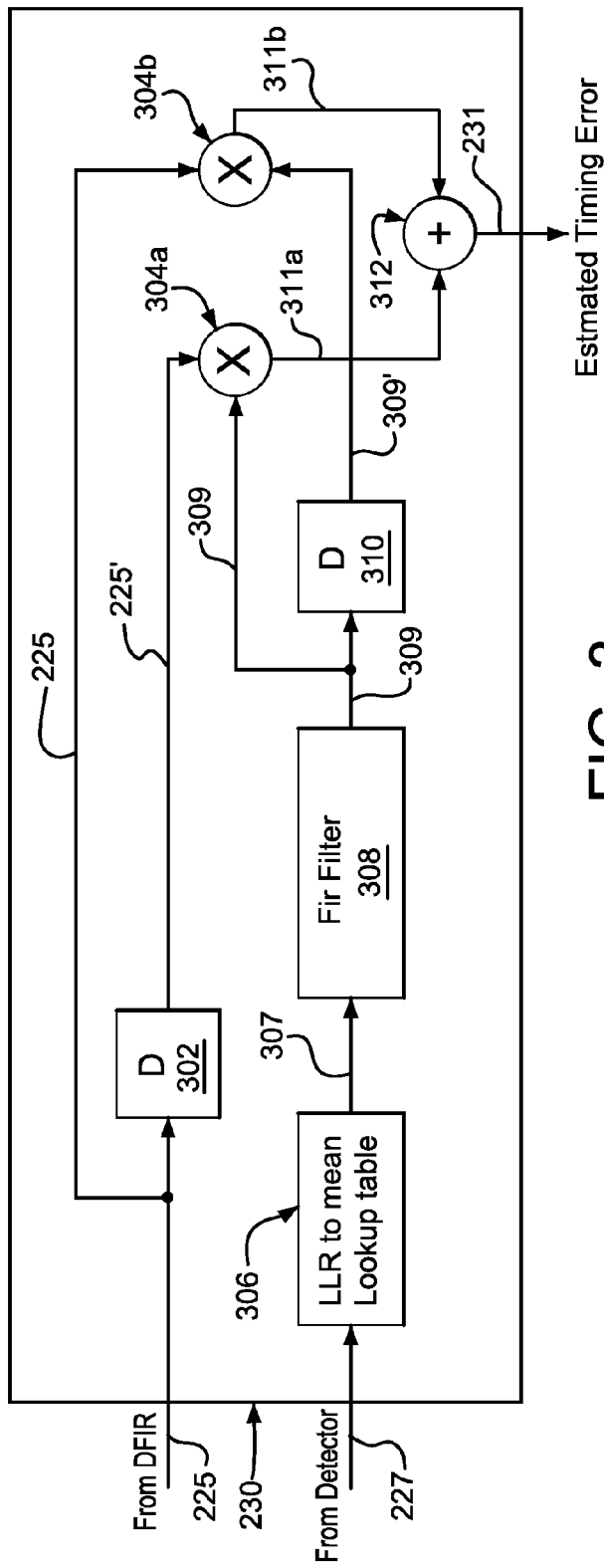
FIG. 3 is a block diagram of the phase detector of the read channel of FIG. 2.
FIG. 4 is a look-up table (LUT) for an exemplary operation of the phase detector of FIG. 3.

FIG. 2 is a block diagram of a read channel 200 for a hard drive employing a "soft" phase detector 230 of the disclosed subject matter. Like read channel 100 of FIG. 1, read channel 200 receives an analog input signal 221 corresponding to data stored on the hard drive and generates a digital decoded output signal 229 representing the data stored on the hard drive. Elements 222-236 and signals 221-237 of FIG. 2 are analogous to elements 122-136 and signals 121-137 of FIG. 1, respectively. With the exception of phase detector 230, each of the elements of FIG. 2 operates in a manner similar to the corresponding element of FIG. 1.

Unlike phase detector 130 of FIG. 1, which generates estimated timing error signal 131 based on equalized digital signal 125 from equalizer 124 and only the sign bits of LLR values 127 from soft detector 126, phase detector 230 of FIG. 2, generates estimated timing error signal 231 based on equalized digital signal 225 from equalizer 224 and the complete LLR values 227 from soft detector 226. By using all of the bits of LLR values 227 (i.e., the sign bits and the multi-bit confidence values, also known as the soft information of NRZ), phase detector 230 is able to weight the impact of LLR values 227 on the resulting estimated timing error signal 231 based on the magnitude of the multi-bit confidence values. The greater the multi-bit confidence value, the more confidence exists in the value of the sign bit and the greater the impact on the estimated timing error signal.

Phase detector 230 utilizes the confidence value to determine the reliability of the sign bit and generates an estimated timing error signal that is more accurate when compared to using only the sign bit of the input LLR value. As opposed to the "all or nothing" operation of phase detector 130 of FIG. 1, phase detector 230 is known as a "soft" phase detector. LLR values having numbers of bits other than five are possible in other implementations of read channel 200.

FIG. 3 shows a block diagram of phase detector 230 of FIG. 2. Phase detector 230 receives equalized digital signal 225 from equalizer 224 and LLR values 227 from soft detector 226, for example, five-bit LLR values with one sign bit and a four-bit confidence value, which indicates the reliability of the sign bit.

Each equalized digital value 225 is subjected to a one-clock-cycle delay in delay mechanism 302, with the resultant delayed signal 225' received by multiplier 304a. Equalized signal 225 is also sent directly (i.e., without delay) to multiplier 304b.

Each of the LLR values 227 is input into module 306, which implements a look-up table (LUT) that maps each input LLR value 227 to a corresponding current mean value 307. FIG. 4 shows an exemplary LUT that maps each input LLR value to a current mean value. The aforementioned mapping may alternatively be performed using a continuous function, such as a piece-wise linear function, that converts different LLR values into corresponding current mean values.

Module 306 sends the mean values 307 to finite impulse response (FIR) filter 308, which convolves the mean values with a partial response (PR) target to generate filtered signal 309. The PR target provides tap coefficients for FIR filter 308 for equalization. For example, FIR filter 308 may be a two-tap 8/14 FIR filter, expressed as:

$$X = 14 \cdot Ymc + 8 \cdot Ymp,$$

where:
X is the current value of filtered signal 309 outputted by FIR filter 308, Ymc is the current value of mean signal 307 outputted by module 306, and Ymp is the previous value of mean signal 307 (i.e., from the previous clock cycle).

In alternative implementations, PR targets having other tap coefficients, values, and/or other numbers of taps can be used.

Each filtered value 309 is subjected to a one-clock-cycle delay in delay mechanism 310, with the resultant delayed signal 309' received by multiplier 304b. Filtered signal 309 is also sent directly (i.e., without delay) to multiplier 304a.

Multiplier 304a multiplies delayed equalized signal 225' and undelayed filtered signal 309 to generate product signal 311a, while multiplier 304b multiplies undelayed equalized signal 225 and delayed filtered signal 309' to generate product signal 311b. Difference node 312 generates estimated timing error signal 231 based on the difference between product signals 311a and 311b.

Figure 5:
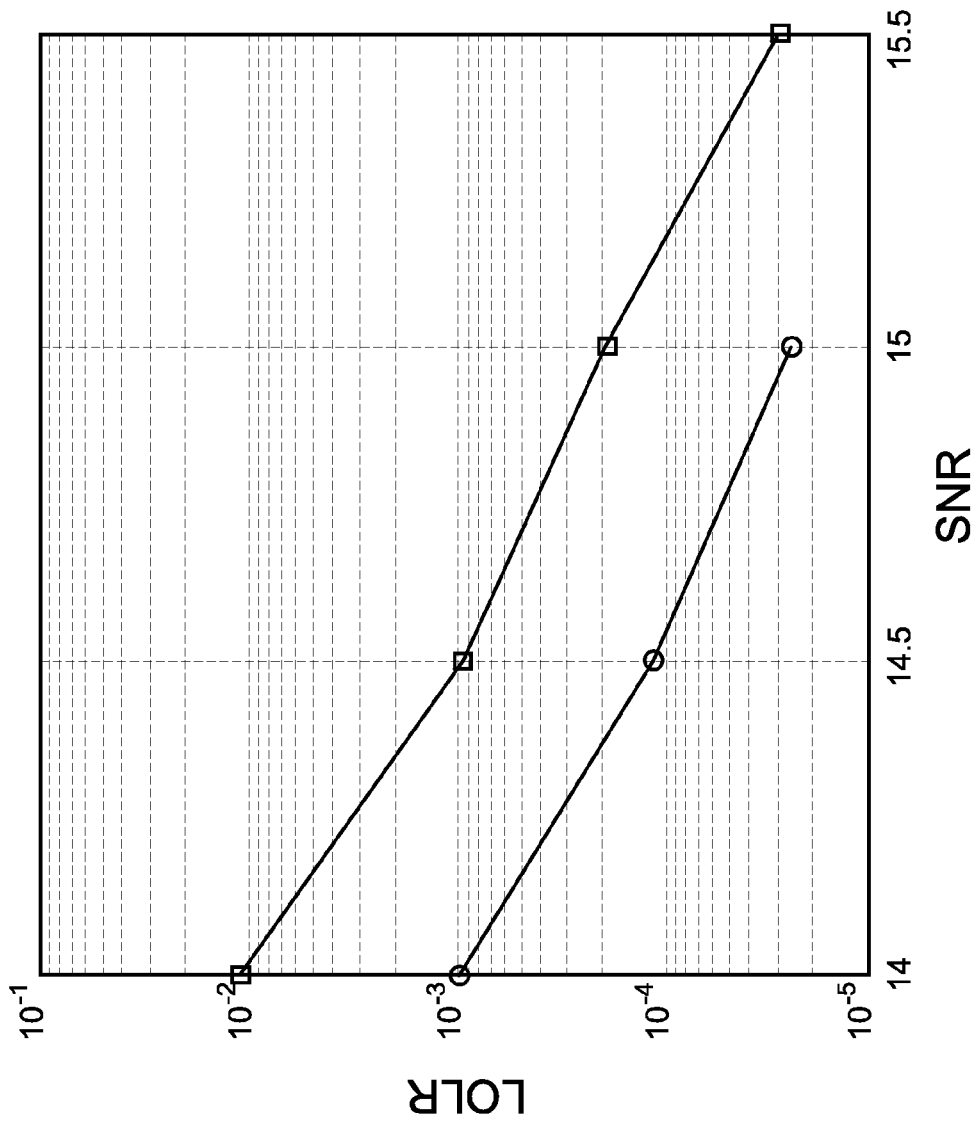
FIG. 5 is a graphical representation of the performance of the disclosed read channel of FIG. 2 versus the prior-art read channel of FIG. 1.

FIG. 5 is a graphical representation of the performance of read channel 200 of FIG. 2 versus prior-art read channel 100 of FIG. 1. In particular, FIG. 5 shows the loss-of-lock rate (LOLR) for each read channel as a function of signal-to-noise ratio (SNR), where the results for prior-art read channel 100 are indicated by squares, and the results for read channel 200 are indicated by circles. For a given SNR value, read channel 200 provides about an order of magnitude improvement in LOLR compared to prior-art read channel 100.

Although the disclosed subject matter was discussed in the context of a phase detector that generates estimated timing errors based on LLR values, the disclosed subject matter can be implemented using values other than LLR values.

Although the disclosed subject matter was discussed in the context of a phase detector for timing recovery within a hard-drive read channel, the disclosed subject matter can be implemented for other applications.

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, micro controller, or general purpose computer.

The above-described processes including portions thereof can be performed by software, hardware, and combinations thereof. These processes and portions thereof can be performed by computers, computer-type devices, workstations, processors, micro-processors, other electronic searching tools and memory, and other storage-type devices associated therewith. The processes and portions thereof can also be embodied in programmable storage devices, for example, compact discs (CDs) or other discs including magnetic, optical, etc., readable by a machine or the like, or other computer usable storage media, including magnetic, optical, or semi-conductor storage, or other source of electronic signals.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The processes (methods) and systems, including components thereof, herein have been described with exemplary reference to specific hardware and software. The processes (methods) have been described as exemplary, whereby specific steps and their order can be omitted and/or changed by persons of ordinary skill in the art to reduce these embodiments to practice without undue experimentation. The processes (methods) and systems have been described in a manner sufficient to enable persons of ordinary skill in the art to readily adapt other hardware and software as may be needed to reduce any of the embodiments to practice without undue experimentation and using conventional techniques.

While preferred embodiments of the disclosed subject matter have been described, so as to enable one of skill in the art to practice the present disclosed subject matter, the preceding description is intended to be exemplary only. It should not be used to limit the scope of the disclosed subject matter, which should be determined by reference to the following claims.

The invention claimed is:

1. A signal processor comprising:
   a signal processing path that converts an analog input signal into a digital output signal, wherein the signal processing path generates multi-bit soft values, each multi-bit soft value having a sign bit and a multi-bit confidence value; and
   a timing recovery loop that uses the sign bits and one or more bits of the multi-bit confidence values of the soft values to generate a sampling clock signal used by the signal processing path to sample the analog input signal, wherein the timing recovery loop comprises a phase detector that generates an estimated timing error signal based on the sign bits and the one or more bits of the multi-bit confidence values of the soft values, wherein the estimated timing error signal is used to adjust a local oscillator (LO) clock signal to generate the sampling clock signal, wherein the phase detector comprises:
      a module that generates mean values based on the sign bits and the one or more bits of the multi-bit confidence values of the soft values;
      a filter that filters the mean values to generate filtered values;
      a first delay module that delays equalized values from the signal processing path to generate delayed equalized values;
      a second delay module that delays the filtered values to generate delayed filtered values;
      a first multiplier that multiplies the delayed equalized values and the filtered values to generate first product values;
      a second multiplier that multiplies the equalized values and the delayed filtered values to generate second product values; and
      a difference node that generates the estimated timing error signal based on differences between the first and second product values.

2. The signal processor of claim 1, wherein the signal processing path comprises:
   an analog-to-digital converter (ADC) that samples the analog input signal based on the sampling clock signal to generate a digital input signal;
   an equalizer that equalizes the digital input signal to generate an equalized signal;
   a soft detector that generates the soft values from the equalized signal; and
   a decoder that decodes the soft values to generate the digital output signal.

3. The invention signal processor of claim 1, wherein the timing recovery loop further comprises:
   a loop filter that filters the estimated timing error signal to generate an averaged error signal; and
   an interpolator that adjusts phase of the LO clock signal based on the averaged error signal to generate the sampling clock signal.

4. The signal processor of claim 1, wherein the mean value generating module implements a look-up table that converts the soft values to corresponding mean values.

5. The signal processor of claim 4, wherein, for each soft value:
   the sign of the corresponding mean value is based on the sign bit of the soft value; and
   the magnitude of the corresponding mean value is based on the magnitude of the one or more bits of the multi-bit confidence value.

6. The signal processor of claim 5, wherein the multi-bit confidence value includes four bits.

7. A signal processor-implemented method for signal processing comprising:
   (a) the signal processor converting an analog input signal into multi-bit soft values, each multi-bit soft value having a sign bit and a multi-bit confidence value; and
   (b) the signal processor using the sign bits and one or more bits of the multi-bit confidence values of the soft values to generate a sampling clock signal used in to sample the analog input signal, wherein:
   using the sign bits and the one or more bits of the multi-bit confidence values of the soft values includes generating an estimated timing error signal from the sign bits and the one or more bits of the multi-bit confidence values of the soft values to adjust a local oscillator (LO) clock signal to generate the sampling clock signal; and
   generating the estimated timing error signal comprises:
      generating mean values based on the sign bits and the one or more bits of the multi-bit confidence values of the soft values;
      filtering the mean values to generate filtered values;
      generating equalized values from the analog input signal;
      delaying the equalized values from a signal processing path to generate delayed equalized values;
      delaying the filtered values to generate delayed filtered values;
      multiplying the delayed equalized values and the filtered values to generate first product values;
      multiplying the equalized values and the delayed filtered values to generate second product values; and
      generating the estimated timing error signal based on differences between the first and second product values.

8. The signal processor-implemented method of claim 7, additionally comprising:
   sampling the analog input signal based on the sampling clock signal to generate a digital input signal;
   equalizing the digital input signal to generate an equalized signal
   generating the soft values from the equalized signal; and
   decoding the soft values to generate the digital output signal.

9. The signal processor-implemented method of claim 7, additionally comprising:

filtering the estimated timing error signal to generate an averaged error signal; and adjusting phase of the LO clock signal based on the averaged error signal to generate the sampling clock signal.

10. The signal processor-implemented method of claim 7, additionally comprising implementing a look-up table to convert the soft values to corresponding mean values.

11. The signal processor-implemented method of claim 10, wherein, for each soft value:

the sign of the corresponding mean value is based on the sign bit of the soft value; and the magnitude of the corresponding mean value is based on the magnitude of the one or more bits of the multi-bit confidence value.

12. The signal processor-implemented method of claim 11, wherein the multi-bit confidence value includes four bits.

13. Apparatus for signal processing comprising:

(a) means for converting (e.g., 222, 224, 226, 228) an analog input signal (e.g., 221) into multi-bit soft values, each multi-bit soft value having a sign bit and a multi-bit confidence value; and (b) means for using the sign bits and one or more bits of the multi-bit confidence values of the soft values to generate a sampling clock signal (e.g., 237) used to sample the analog input signal, wherein means (b) comprises:

means for generating an estimated timing error signal based on the sign bits and the one or more bits of the multi-bit confidence values of the soft values, wherein the estimated timing error signal is used to adjust a local oscillator (LO) clock signal to generate the sampling clock signal, wherein the means for generating comprises:

means for generating mean values based on the sign bits and the one or more bits of the multi-bit confidence values of the soft values;

means for filtering the mean values to generate filtered values;

means for delaying equalized values from the signal processing path to generate delayed equalized values;

means for delaying the filtered values to generate delayed filtered values;

means for multiplying the delayed equalized values and the filtered values to generate first product values;

means for multiplying the equalized values and the delayed filtered values to generate second product values; and means for generating the estimated timing error signal based on differences between the first and second product values.

\* \* \* \* \*